(12) United States Patent
Sugaya et al.

(10) Patent No.: US 6,758,662 B2
(45) Date of Patent: Jul. 6, 2004

(54) DIE FOR DIE COMPACTING OF POWDERED MATERIAL

(75) Inventors: Yoshimi Sugaya, Chiba (JP); Makoto Iwakiri, Chiba (JP)

(73) Assignee: Hitachi Powdered Metals Co., Ltd., Chiba (JP)

( * ) Notice: Subject to any disclaimer, the term of this patent is extended or adjusted under 35 U.S.C. 154(b) by 283 days.

(21) Appl. No.: 10/037,062

(22) Filed: Oct. 19, 2001

(65) Prior Publication Data

US 2002/0102318 A1 Aug. 1, 2002

(30) Foreign Application Priority Data

Oct. 23, 2000 (JP) ..................................... P2000-322890

(51) Int. Cl.[7] .............................................. B29C 43/02
(52) U.S. Cl. ........................ 425/78; 425/355; 425/410
(58) Field of Search .......................... 425/78, 352, 353, 425/355, 406, 410

(56) References Cited

U.S. PATENT DOCUMENTS 4,573,895 A * 3/1986 DeSantis et al. .............. 425/78
4,818,201 A * 4/1989 Howard ........................ 425/78
5,851,568 A * 12/1998 Huang ......................... 425/356
6,558,144 B1 * 5/2003 Gueydan et al. .............. 425/78

* cited by examiner

Primary Examiner—Robert Davis
Assistant Examiner—Thu Khanh T. Nguyen
(74) Attorney, Agent, or Firm—Brenda O. Holmes; Kilpatrick Stockton LLP

(57) ABSTRACT

Disclosed is a die for compacting a powdered material. The die has a die body having a penetrating die cavity to which a couple of punches are adapted to apply for pressing the powdered material to be supplied to form a compact, and a die holder having a bore into which the die body is shrink fitted. The die cavity is provided with a coating composed of a material which is selected from the group consisting of titanium carbide, titanium nitride, alumina, titanium cyanide, hafnium nitride, chromium nitride, tungsten carbide and DLC, and the die holder is composed of a steel material which is prepared by tempering at a temperature higher than a treatment temperature at which the coating is provided on the die cavity. The die cavity is tapered at a ratio within a range of 1/5,000 to 1/1,000.

12 Claims, 3 Drawing Sheets

DIE FOR DIE COMPACTING OF POWDERED MATERIAL

BACKGROUND OF THE INVENTION

1. Field of the Invention

The present invention relates to a die of a die compacting assembly for compacting a powdered material which is used in the field of powder metallurgy, and more particularly to a die which is suitably used in manufacture of a powder compact of high density, compacting of a hard powder such as magnetic alloy powder and the like, or compacting of a soft powder easily adhering to the die such as aluminum powder.

2. Description of the Related Art

A die compacting assembly for compacting a powdered material comprises a die unit including a die cavity corresponding to the contour of a pellet or powder compact to be produced, and upper and lower punches adapted to be applied to top and bottom of the die cavity. It can also comprises a core rod for providing a hole on the powder compact, as necessity arises. The die compacting assembly is assembled in a press machine and used as powder compacting apparatus. The powdered material is filled into the die cavity which is defined by the die cavity and the lower punch, and the upper punch is relatively moved to the lower punch to press the powdered material, whereby the powdered material is compressed between the upper and lower punches to form a compact of the powdered material. The powder compact is then ejected to the powder-charged side of the die cavity and stripped from the die unit.

Density of the powder compact is determined by the compacting pressure, and a powder compact having high density is often required in manufacture of machine components having high strength. However, it necessitates due consideration to the strength of the die unit corresponding to the high compacting pressure. Moreover, in a case where a hard powder such as a magnetic alloy powder prepared by the quench and solidification method is to be compacted in high density, the powder compacting is more difficult. Additionally, as the powder compacting is repeated, the inside wall of the die cavity is gradually worn at the area to which the pressure is concentrated, and the die cavity is swollen in the middle. As a result, the ejection resistance of the formed compact is increased, and the obtained compact is often flawed or cracked. Moreover, in the case of compacting a powdered material likely to be adhered to the wall of the die cavity such as aluminum powder, it is extremely difficult to manufacture a compact of high density, in beautiful appearance and with small variation.

In the above-described circumstances, the applicant of the present application has previously suggested a powder compacting die and a compacting method using the die which are disclosed in Japanese Patent Application Laid-Open No. 5-320705, in which a compact of the powdered material compressed in high density is favorably ejected from the die by lower pressure. The applicant has also suggested a method of compacting a sintered product of high density at high efficiency, which is disclosed in Japanese Patent Application Laid-Open No. 11-140505. The powder compacting die of the former publication is characterized by taper of 1/5,000 to 1/1,000 which is provided on the die cavity for expanding the width of the die cavity at the side which the formed compact is removed, and the compacting method using the die is characterized by using upper and lower punches which are fitted in the die cavity to press the powdered material, and particularly using the punch of the larger bore side in the majority of the compressing process or at least in the final stage of compression. The powder compacting method of the latter publication is characterized by combining a die lubrication method in which a film of a lubricant is formed on the inside wall of the die cavity, and a powder lubrication method in which the amount of the powder lubricant to be added is suppressed to 0.3% or less, preferably to 0.05 to 0.3%.

When the powdered material is compressed, the powdered material is compressed by the pressure applied by punching. However, at the same time, friction occurs on the inside wall of the die cavity between the inside wall and the powdered material being pressed, so that the compressing force effecting on the powdered material from the punching pressure is reduced by that friction. Moreover, the force necessary for removing the powder compact from the die cavity after the die compacting is proportional to the friction between the wall of the die cavity and the compact. Therefore, if the friction between the compact and the wall of the die cavity is decreased, it becomes possible to eject the compact with a smaller pressure and obtain a compact of higher density at high yield. In this connection, it has been conventionally known that treatment of the surface of the die with CVD or the like is effective as means for reducing the friction at the die cavity, and this method has been widely employed.

On the other hand, for the die structure for the powder compacting, generally, a shrink fit die which is formed by shrink fitting a ring (die holder) of structural alloy steel to the outer circumference of the die body having a die cavity is widely used for the purpose of reinforcement of the die body. However, if the surface of the shrink fit die is subjected to surface coating treatment, the shrink fitting force is lowered. To the contrary, if the ring is shrink fitted after the die body is subjected to surface coating treatment, the dimensions of the die cavity determined on the coating is changed due to the effects of heat for shrink fitting and the dimensional precision is therefore impaired.

BRIEF SUMMARY OF THE INVENTION

With these problems in mind, it is therefore an object of the present invention to provide a powder compacting die in which the wear resistance is enhanced, the friction of the inside wall of the die cavity is reduced, a compact of powder compressed in high density is ejected with a lower pressure than that in the conventional art, and sintered products of high density are possibly produced efficiently.

In order to achieve the above-mentioned object, a die for compacting a powdered material, according to an aspect of the present invention comprises: a die body having a penetrating die cavity to which a couple of punches are adapted to apply for pressing the powdered material to be supplied to form a compact, the die cavity being provided with a coating composed of a material which is selected from the group consisting of titanium carbide, titanium nitride, alumina, titanium cyanide, hafnium nitride, chromium nitride, tungsten carbide and DLC; and a die holder having a bore into which the die body is shrink fitted, the die holder being composed of a steel material which is prepared by tempering at a temperature higher than a treatment temperature at which the coating is provided on the die cavity.

BRIEF DESCRIPTION OF THE SEVERAL VIEWS OF THE DRAWINGS

The features and advantages of the die according to the present invention over the proposed art will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE INVENTION

Figure 1:
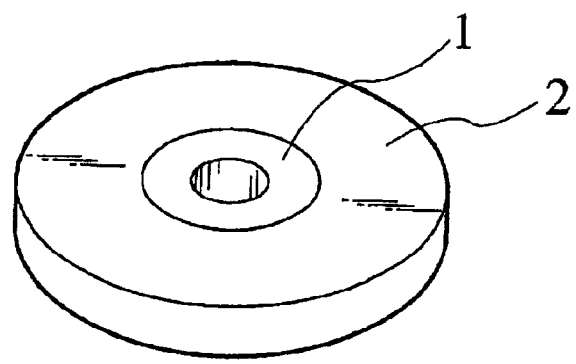
FIG. 1 is a perspective view showing the shape of the die.

Referring now to the drawings, embodiments of the die for the powder compacting according to the present invention will be described.

FIG. 1 shows an embodiment of the die for compacting a powdered material according to the present invention, and it comprises a die body 1 being made of a hard material such as steel, etc. in a cylindrical shape and having a die cavity axially penetrating the center thereof, for defining a die cavity with upper and lower punches and determining the contour of the powder compact to be produced. The die also comprises an annular die holder 2 having a cylindrical bore in which the die body 1 is tightly fitted. Moreover, a coating composed of at least one component selected from titanium carbide (TiC), titanium nitride (TiN), aluminum oxide ($Al_2O_3$), titanium cyanide (TiCN), hafnium nitride (HfN), chromium nitride (CrN), tungsten carbide ($W_2C$) and DLC (Diamond-like Carbon) is formed on the surface of the die including the inside wall of the die cavity. The material composing the die holder is a steel material of which tempering temperature is higher than the temperature at which the coating is formed on the die.

More specifically, the coating on the surface of the die, which can be of a single layer or plural layers, is formed by PVD (physical vapor deposition) treatment or plasma CVD (plasma-used chemical vapor deposition) treatment. The material composing the die holder 2 is a steel material which is prepared by tempering at a higher temperature than the temperature of PVD treatment or plasma CVD treatment.

Although the die cavity is formed in a substantially columnar shape corresponding to the shape of the powder compact to be produced, it is preferred to provide a slight taper at a ratio of 1/5,000 to 1/1,000, in which the compact formed in the die cavity is removed by pushing the compact off to the wider side of die cavity at which the width of the die cavity is larger.

If the die cavity is slightly tapered, the area of cross section perpendicular to the axial direction of the pressed powder is decreased by the degree of the tapering according as the powder is pushed in the die cavity from the wider side toward the narrower side, while the frictional resistance between the powder and the inside wall of the die cavity is kept almost same as the case of no taper. Accordingly, the powder is compressed also in the direction perpendicular to the axial direction or the pressing direction by the punch, in addition to the compression in the pressing direction by the punch. Therefore, a higher density is obtained as compared with the die cavity without taper. On the other hand, the force necessary for ejecting the compact from the die cavity is equal to the friction resistance between the compact of the compressed powder and the inside wall of the die cavity. Then, in the tapered die cavity, the compressed powder is gradually released from the inside wall along with moving back toward the wider side of the die cavity, so that the ejection force becomes small. According to the results of researches, the effect of tapering is significant at a ratio of 1/5,000 or more than 1/5,000. However, if the tapering is excessively large, the contour of the obtained compact is also tapered and the dimensional precision is deteriorated. Therefore, the upper limit is determined to 1/1,000.

The coating is preferably provided by forming a layer by PVD treatment or plasma CVD treatment. The treating temperature of PVD or plasma CVD is as low as 500 to 550 degrees centigrade. Accordingly, if the die holder to be shrink fitted to the outer circumference of the die body for reinforcement is made of a steel material of which tempering temperature is 550 degrees centigrade or higher, the base material of die holder is possibly prevented from being made soft when the shrink fit die is subjected to coating treatment by plasma CVD or the like. Therefore, the shrink fitting force can be prevented from being deteriorated while the coating layer is formed, and it is then easy to enhance the wear resistance of the die body and decrease the friction on the inside wall of the die cavity. This also makes possible to decrease the affinity between the die surface and the pressed powder and prevent the adhesion therebetween. The coating can be formed in a single layer of TiC, TiN, $Al_2O_3$, TiCN, HfN, CrN, $W_2C$ or DLC, and it is also possible to form in two layers with combination of TiC—TiN, TiC—TiCN, etc., three layers of TiC—TiCN—TiN and the like, or in other multiple layers. It can be selected depending on the die material or the conditions for compacting. The coating may be formed on at least the inside wall of the die cavity, and it is not essential to provide the coating on the entire surface of the die.

For the material of the die holder suited is a steel material having composition of, at ratio by mass, 0.2 to 0.6% carbon; 0.15 to 1.2% silicon; 1.2% or less of manganese; 0.03% or less of phosphorus; 0.03% or less of sulfur; 0.4 to 5.5% chromium; at least one of 0.25 to 3.5% nickel, 0.2 to 3.0% molybdenum, 1.0 to 10% tungsten, 2.2% or less of vanadium and 3.8 to 4.5% cobalt; and the balance iron, which can contain an inevitable amount of impurities. The above steel material is preferred because the strength is high and the tempering temperature required for preparation is 530 degrees centigrade or higher. Specific examples of the steel material whose composition is in the above range include the materials which are specified to SKD4, SKD5, SKD6, SKD61, SKD62, SKD7, SKD8, SKT3 and SKT4 in Japanese Industrial Standard as the grades of steel for hot mold tools. These materials are high in strength and over 530 degrees centigrade in required tempering temperature. Moreover, the materials specified to SNCM431, SNCM625, SNCM630, SNCM240, SNCM439 and SNCM447 in JIS as structural steel grades, which are also high in tempering temperature and strength, are also suitable as a material for the die holder.

In the powder compacting process using the above-described powder compacting die according to the invention, the powdered material is filled in the die cavity formed by the die body and the lower punch applied to the bottom (the narrower side) of die cavity. It is then pressed by the upper and lower punches and the compressed powder is compacted. The compact is ejected from the die cavity by pushing it upward by the lower punch. It is of course possible to turn the die upside down and eject the compact from the bottom side of the die. Here, it is noted that a die lubricant is preferably used to form a lubrication film on the inside wall of the die cavity, and that a powder lubricant of 0.3% by weight or less is preferably added to the powdered material.

As a result of compacting, a powder compact of a thick or thin columnar shape such as cylinder, elliptic cylinder, polygonal pole, asterisk pole, toothed pole, circular or elliptic disk, polygonal plate and the like is obtained. If a core rod for providing a hollow on the compact is used, a powder compact of a thick or thin annular shape such as tube, wheel, toothed wheel and tube and the like is also possibly manufactured.

In this powder compacting process, it is possible by the addition of the powder lubricant at 0.3% or less, preferably 0.05 to 0.2%, to the material powder to remarkably improve flow rate of the powdered material, without any practical change in the density of the compact, and friction between the particles of the pressed powder is possibly decreased as well. Moreover, the friction between the inside wall of the die cavity and the pressed powder is also decreased by further combining with the die wall lubrication method, and it is possible to form a compact of compressed powder in higher density and eject the compact with a further lower pressure by the above-mentioned advantageous action of the powder compacting die of the invention.

EXAMPLES

Example 1

In this example, using various shrink fitting die, searches were made for the changes which are caused on the shrink fitting force, depending on the materials composing the die body and the die holder and presence or absence of a coating provided by plasma CVD treatment. The testing method for the searches is as follows.

First, as samples of the powder compacting die composed of the die body and die holder, test pieces Nos. 1 to 9 as shown in Table 1 were prepared, respectively, by selecting a material for the die body from JIS materials of SKH51 and SKD4 and a material for the die holder from those of SNCM447, SKD61, SKH51, SKD1 and SNCM447 as shown in Table 1, preparing a die body sample and a die holder sample which were made of the selected materials, and shrink fitting the die body sample to the die holder sample as shown in FIG. 1. For the test pieces No. 2, 3, 5, 6, 7, 8 and 9, they were further subjected to plasma CVD treatment (at 530 degrees centigrade) to provide a coating of TiN—TiCN—Ti. The test pieces No. 1 and 4 were not subjected to the plasma CVD treatment. Here, the axial length of the shrink fit die of FIG. 1 was 5 mm, and the shrink fitting clearance between the die body 1 (outer diameter: 10 mm, inner diameter at the die cavity: 4 mm) and die holder 2 (outer diameter: 26 mm, inner diameter at the bore: 10 mm) was set at 0.03 mm (0.3%).

Figure 2:
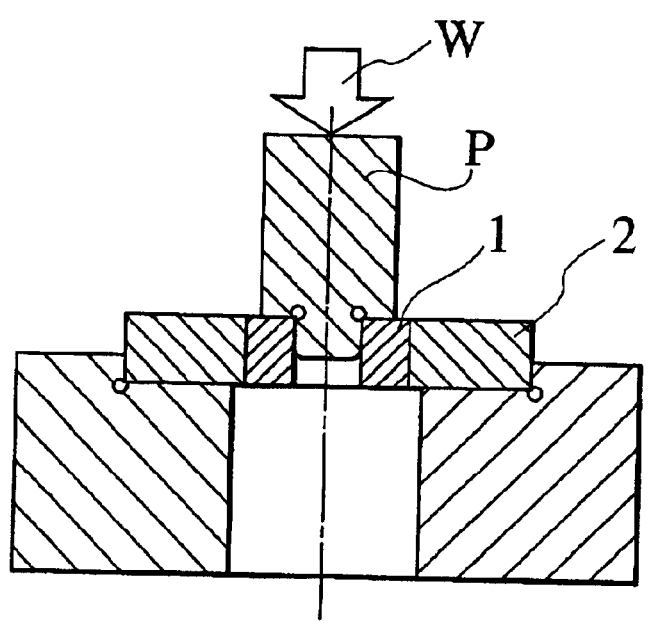
FIG. 2 is a schematic cross-sectional view for illustration of the method for measuring the load by which the die is broken.

Next, each of the test pieces Nos. 1 to No. 9 were subjected to the measurement of die separation load (kN) (i.e., the load W applied to the punch P under which the die body 1 separated from the die holder 2) by the operation as illustrated in FIG. 2, for estimation of the shrink fitting force. The results are shown in Table 1.

TABLE 1

| Test Piece No. | Material of Die Body | Material of Die Holder | Plasma CVD Treatment | Die Separation Load (kN) |
|---|---|---|---|---|
| 1 | SKH51 | SNCM447 | — | 72 |
| 2 | SKH51 | SNCM447 | subjected | 75 |
| 3 | SKH51 | SKD61 | subjected | 84 |
| 4 | SKH51 | SKD1 | — | 78 |
| 5 | SKH51 | SKD1 | subjected | 58 |
| 6 | SKD-4 | SKH51 | subjected | 89 |
| 7 | SKD-4 | SKD61 | subjected | 126 |
| 8 | SKD-4 | SNCM447 | subjected | 107 |
| 9 | SKD-4 | SNCM447 | subjected | 92 |

It is known from Table 1 that, in the test piece No. 5 which was low in tempering temperature (approximately 180 degrees centigrade) of the die holder material, softening of material was caused by the plasma CVD treatment and the die separation load decreased. In contrast, in the test pieces Nos. 2, 3 and 6 to 9 which are high in tempering temperature (approximately 580 degrees centigrade) of the die holder material, the die separation load was high and decrease in the die separation load was hardly caused by the thermal effect of plasma CVD treatment.

Example 2

In this example, using various shrink fit die, the powder compacting was carried out to form compacts and searches were made for variation in the dimensions of powder compacts and ejection force of compact, depending on the various conditions, i.e, tapering, coating, presence or absence of die wall lubricant and powder lubricant, as follows.

First, as shown in Table 2, each of shrink fit die samples Nos. 1 to 19 was prepared by producing a shrink fit die of a die body made of steel material corresponding to SKH of JIS and a die holder made of a steel material of SDK61 of JIS and having a die cavity of 25 mm in diameter, providing a taper (expanding at the compact ejection side) of 1/10,000, 1/5,000, 1/2,500, 1/1,000 or 1/500 on the die cavity for the die samples Nos. 4 to 18 and no taper for die samples Nos. 1 to 3 and 19, and forming a TiN—TiCN multi-layer coating by plasma CVD for only the die samples Nos. 1, 3, 4, 6, 7, 9, 10, 12–14 and 16–18.

Next, as a raw material powder, a mixed powder of 1.5% by mass of copper powder, 1.0% by mass of graphite powder and the balance pure iron powder was prepared. To this mixed powder, 0.1% by mass, 0.3% by mass or 0.8% by mass of zinc stearate powder was added as a powder lubricant.

Using each of the shrink fit die samples and one of the above mixed powders, and applying a die wall lubricant (zinc stearate) to the die cavity for only the die samples Nos. 3, 6, 9, 12, 13, 16, 18 and 19, powder compacting operation for forming a compact having dimensions of $\phi 25 \times \phi 10 \times 15L$ and density of 6.8 g/cm$^3$ was repeatedly carried out. At this time, the compacting pressure (MPa) necessarily applied to the punch, the ejection force for removing the compact by the lower punch pushing the compact off the die cavity (in the Table 2, ejection force (kN)) were measured. Moreover, the density (for affirmation of proper operation) and dimensions of the obtained compacts were measured for estimation of size variation in the formed compacts. The results are shown in Table 2 in which the size variation, ±σ (mm), of the obtained compacts is shown for the diameter (25 mm) of compact. Moreover, the relationship between the tapering ratio and the compacting pressure is summarized in FIG. 3, and the relationship between the tapering ratio and the ejection force is shown in FIG. 4.

TABLE 2

| No. | Sample Tapering Ratio | Coat | Die Lub. | Powder Lub. (mass %) | Compacting Pressure (MPa) | Ejection Force (kN) | Size Variation ±σ (mm) |
|---|---|---|---|---|---|---|---|
| 1 | — | PCVD* | — | 0.8 | 480 | 46.2 | φ25 ± 0.01 |
| 2 | — | — | — | 0.8 | 490 | 49.5 | φ25 ± 0.01 |
| 3 | — | PCVD | use | 0.3 | 440 | 33.3 | φ25 ± 0.01 |
| 4 | 1/10000 | PCVD | — | 0.8 | 480 | 46.2 | φ25 ± 0.01 |
| 5 | 1/10000 | — | — | 0.8 | 490 | 49.5 | φ25 ± 0.01 |
| 6 | 1/10000 | PCVD | use | 0.3 | 440 | 33.3 | φ25 ± 0.01 |
| 7 | 1/5000 | PCVD | — | 0.8 | 460 | 39.4 | φ25 ± 0.01 |
| 8 | 1/5000 | — | — | 0.8 | 480 | 43.8 | φ25 ± 0.01 |
| 9 | 1/5000 | PCVD | use | 0.3 | 430 | 21.7 | φ25 ± 0.01 |
| 10 | 1/2500 | PCVD | — | 0.8 | 460 | 38.6 | φ25 ± 0.01 |
| 11 | 1/2500 | — | — | 0.8 | 480 | 42.9 | φ25 ± 0.01 |
| 12 | 1/2500 | PCVD | use | 0.3 | 430 | 21.2 | φ25 ± 0.01 |
| 13 | 1/2500 | PCVD | use | 0.1 | 414 | 23.3 | φ25 ± 0.01 |
| 14 | 1/1000 | PCVD | — | 0.8 | 460 | 36.9 | φ25 ± 0.015 |
| 15 | 1/1000 | — | — | 0.8 | 480 | 41.0 | φ25 ± 0.015 |
| 16 | 1/1000 | PCVD | use | 0.3 | 430 | 20.2 | φ25 ± 0.015 |
| 17 | 1/500 | PCVD | — | 0.8 | 450 | 35.1 | φ25 ± 0.03 |
| 18 | 1/500 | PCVD | use | 0.3 | 420 | 19.3 | φ25 ± 0.03 |
| 19 | — | — | use | 0.3 | 460 | 36.6 | φ25 ± 0.01 |

*PCVD: plasma CVD

Figure 3:
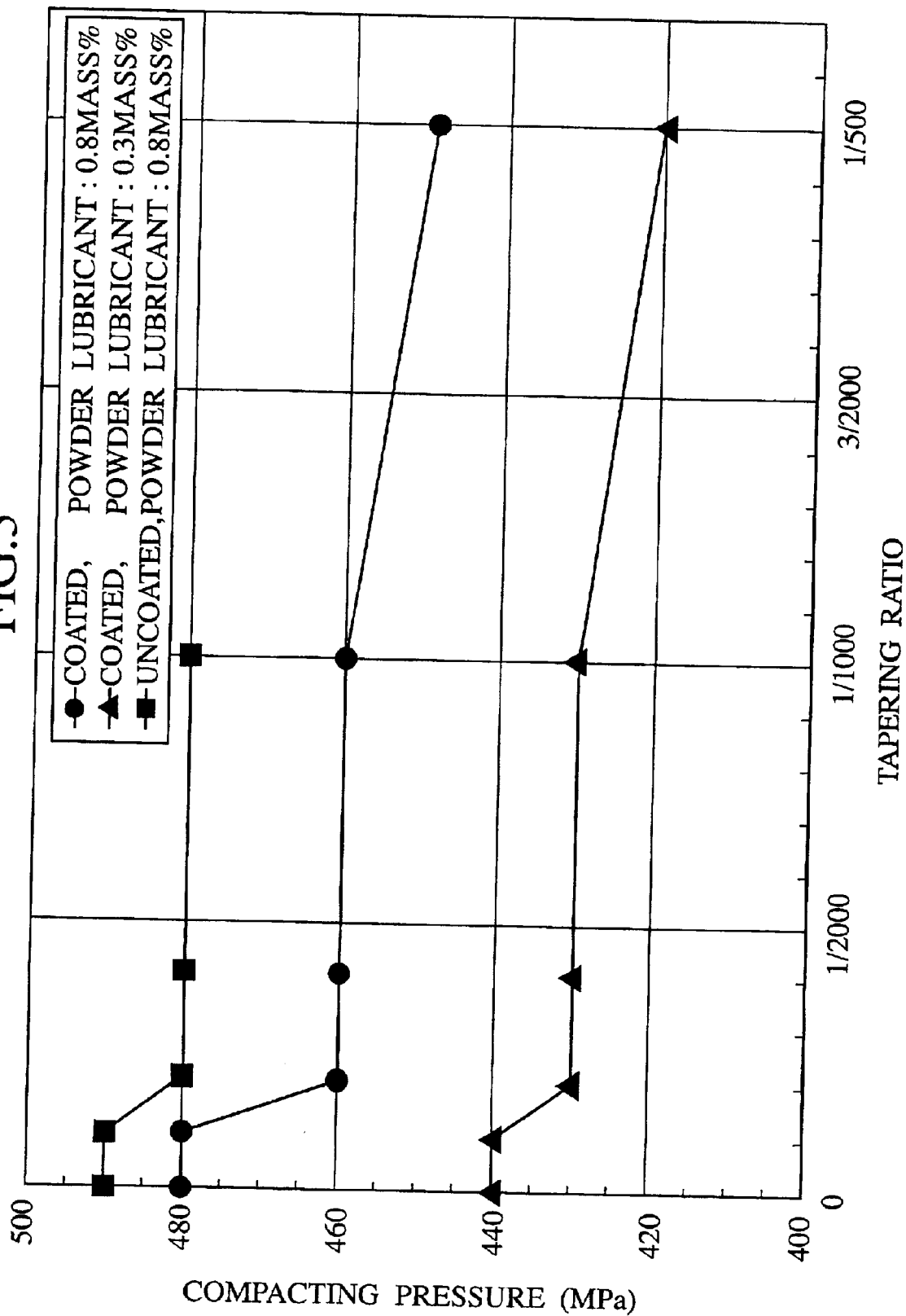
FIG. 3 shows a graph showing the relationship between the tapering ratio and the compacting pressure.
Figure 4:
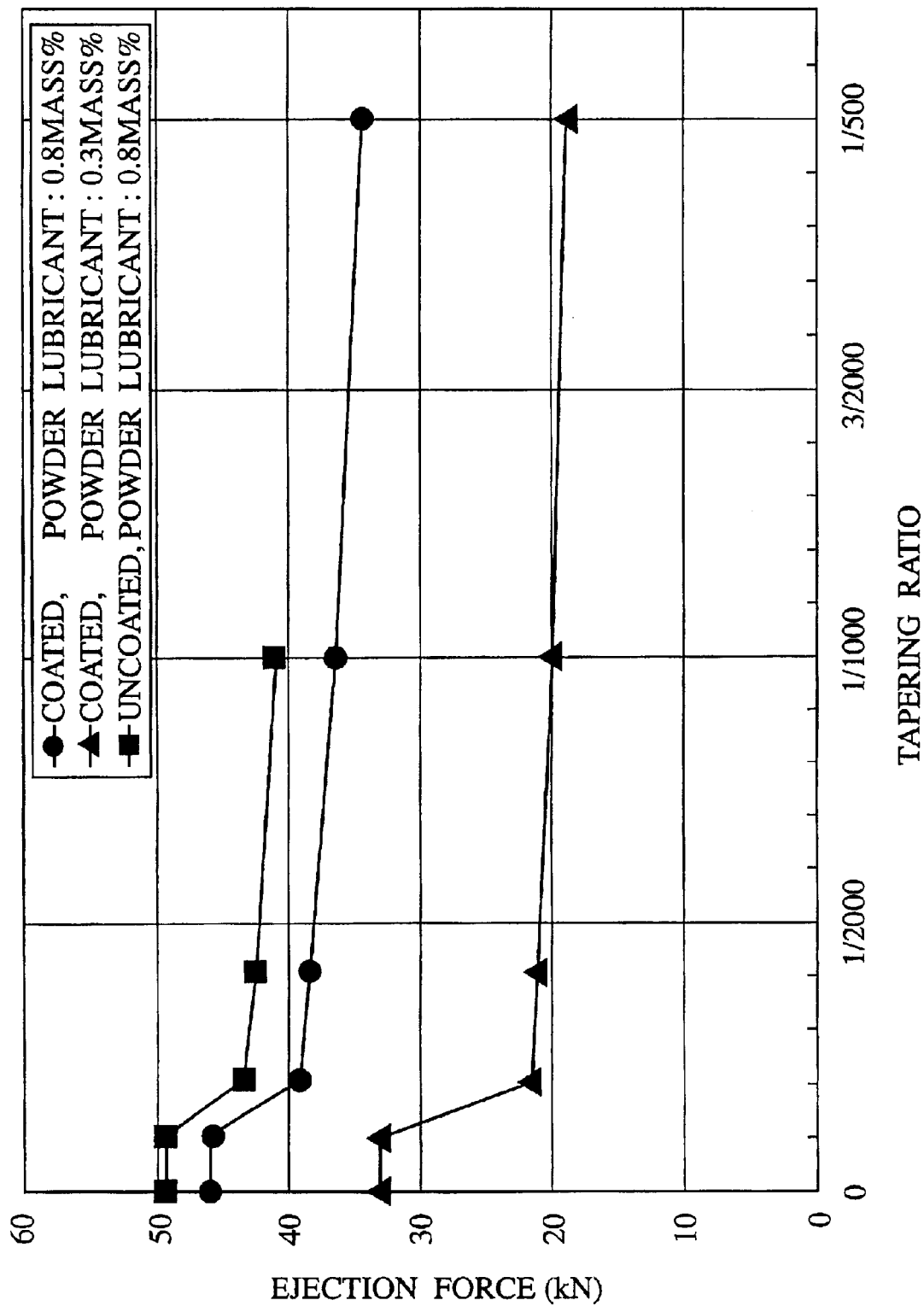
FIG. 4 shows a graph showing the relationship between the tapering ratio and the ejection force against which the powder compact is removed from the die cavity.

It is understood from Table 2 and FIGS. 3 and 4 that, if the tapering ratio is same, the coated die samples (Nos. 1, 4, 7, 10, 14 and 17) are capable of forming compacts of a similar dimensional variation by lower compacting pressure and removing by smaller ejection force, in comparison with uncoated die samples (Nos. 2, 5, 8, 11 and 15). These advantages are more distinctive in the cases of using a die sample in which the content of powder lubricant is suppressed to 0.3% by mass and the die wall lubrication is also used (No. 3, 6, 9, 12, 16, 18 and 19).

Moreover, in any one of using a die having a tapered but uncoated die cavity (Nos. 5, 8, 11 and 15), using a die sample having a tapered and coated die cavity (No. 4, 7, 10, 14 and 17) according to the present invention, or using a die having a tapered and coated die cavity with a controlled amount of powder lubricant and a die lubricant (No. 3, 6, 9, 12, 16, 18 and 19), the following effect is recognized. Namely, the die having a tapered cavity with a taper ratio of 1/10,000 is similar to that without taper, and the effect of tapering to decrease the compacting pressure and the ejection force becomes distinct at a taper ratio of 1/5,000 or more and it increases according as the taper ratio is raised. Moreover, in any of the above-descrived cases, the dimensional variation is on the same level at a taper ratio of up to 1/2,500 but tends to increase according as the taper ratio increases above 1/2,500. In accordance with the above, it is recognized that tapering at a ratio within a range of 1/5,000 to 1/1,000 possibly exhibits the effect of increasing the density and decreasing the ejection force while preventing deterioration of dimensional precision. In addition, as known from samples of Nos. 11 to 13 in Table 2, the required compacting pressure and the ejection force (pressure) are reduced when the content of powder lubricant is suppressed to 0.3% by mass or 0.1% by mass, instead of 0.8% by mass, and the die wall lubricant is applied at the same time.

As described above, in the powder compacting die and the powder compacting method using the same according to the present invention, a coating layer for decreasing friction and adhesion during the powder compacting is applied to the die cavity, while shrink fitting is properly maintained between the die body and the die holder. Accordingly, a powder compact of higher density can be efficiently manufactured with use of a die in which the die cavity is tapered, while friction resistance during compacting of the powder is reduced and the compact ejection force is made small. Therefore, it is particularly effective in compracting of a powdered material which is likely to stick to the die.

This application claims benefit of priority under 35 U.S.C. § 119 to Japanese Patent Application No. 2000-322890, filed on Oct. 23, 2000, the entire contents of which are incorporated by reference herein.

It must be understood that the invention is in no way limited to the above embodiments and that many changes may be brought about therein without departing from the scope of the invention as defined by the appended claims.

What is claimed is:

1. A die for die compacting a powdered material, comprising:
    a die body having a penetrating die cavity to which a plurality of punches are adapted to apply for pressing the powdered material to be supplied to form a compact, the die cavity being provided with a coating composed of a material which is selected from the group consisting of titanium carbide, titanium nitride, alumina, titanium cyanide, hafnium nitride, chromium nitride, tungsten carbide and DLC; and
    a die holder having a bore into which the die body is shrink fitted, the die holder being composed of a steel material which has a composition comprising, at ratio by mass, 0.2 to 0.6% carbon; 0.15 to 1.2% silicon; 1.2% or less of manganese; 0.03% or less of phosphorus; 0.03% or less of sulfur; 0.4 to 5.5% chromium; at least one of 0.25 to 3.5% nickel, 0.2 to 3.0% molybdenum, 1.0 to 10% tungsten, 2.2% or less of vanadium and 3.8 to 4.5% cobalt; and the balance iron.

2. The die of claim 1, wherein the die cavity has a substantially columnar shape excepting that the die cavity is slightly tapered such that the compact formed in the die cavity is ejected from the wider side of the die cavity.

3. The die of claim 1, wherein the die cavity is tapered at a ratio within a range of 1/5,000 to 1/1,000.

4. The die of claim 1, wherein the die cavity has a substantially cylindrical shape excepting that the die cavity is slightly tapered.

5. The die of claim 1, wherein the coating is a physical vapor deposition layer or a plasma-used chemical vapor deposition layer.

6. The die of claim 1, wherein the coating is a single-layer or multi-layer.

7. The die of claim 1, wherein a treatment temperature at which the coating is provided on the die cavity is equal to or lower than 550 degrees centigrade.

8. The die of claim 1, wherein a temperature at which the steel material of the die holder is tempered is equal to or higher than 530 degrees centigrade.

9. The die of claim 1, wherein the steel material composing the die holder is on a grade of steel for hot alloy tool steels or for structural use.

10. A die for compacting a powdered material into a compact, comprising:

a die holder having a bore; and a die body having a penetrating die cavity to which a plurality of punches are adapted to apply for pressing the powdered material to be supplied to form a compact, wherein the die body is shrink fitted into the bore of the die holder before the die cavity is provided with a coating composed of material which is selected from the group consisting of titanium carbide, titanium nitride, alumina, titanium cyanide, hafnium nitride, chromium nitride, tungsten carbide and DLC, wherein the die holder is composed of a steel which has a composition comprising, at ratio by mass, 0.2 to 0.6% carbon; 0.15 to 1.2% silicon; 1.2% or less of manganese; 0.03% or less of phosphorus; 0.03% or less of sulfur; 0.4 to 5.5% chromium; at least one of 0.25 to 3.5% nickel, 0.2 to 3.0% molybdenum, 1.0 to 10% tungsten, 2.2% or less of vanadium and 3.8 to 4.5% cobalt; and the balance iron.

11. A die assembly for compacting a powdered material, comprising:

a die unit comprising a die body having a penetrating die cavity being provided with a coating composed of a material which is selected from the group consisting of titanium carbide, titanium nitride, alumina, titanium cyanide, hafnium nitride, chromium nitride, tungsten carbide and DLC, and a die holder having a bore into which the die body is shrink fitted, the die holder being composed of a steel material which has a composition comprising, at ratio by mass, 0.2 to 0.6% carbon; 0.15 to 1.2% silicon; 1.2% or less of manganese; 0.03% or less of phosphorus; 0.03% or less of sulfur; 0.4 to 5.5% chromium; at least one of 0.25 to 3.5% nickel, 0.2 to 3.0% molybdenum, 1.0 to 10% tungsten, 2.2% or less of vanadium and 3.8 to 4.5% cobalt; and the balance iron; and a plurality of punches which are adapted to apply to the die cavity for pressing the powdered material to be supplied into the die cavity to form a compact.

12. The die of claim 1, wherein the steel material of the die holder is prepared by tempering at a temperature higher than a treatment temperature at which the coating is provided on the die cavity.

* * * * *